United States Patent
Young et al.

(10) Patent No.: US 6,493,862 B1
(45) Date of Patent: Dec. 10, 2002

(54) METHOD FOR COMPRESSING AN FPGA BITSREAM

(75) Inventors: Steven P. Young, San Jose, CA (US); Jeffrey V. Lindholm, Longmont, CO (US)

(73) Assignee: Xilinx Inc., San Jose, CA (US)

(*) Notice: Subject to any disclaimer, the term of this patent is extended or adjusted under 35 U.S.C. 154(b) by 181 days.

(21) Appl. No.: 09/624,813

(22) Filed: Jul. 25, 2000

(51) Int. Cl.[7] .................... G06F 17/50; G06F 15/177; G06F 9/24; G06F 9/445

(52) U.S. Cl. ................. 716/16; 716/18; 713/2; 713/100; 717/114; 711/170

(58) Field of Search .................. 716/1–21; 713/1, 713/2, 100; 717/114–119; 711/170–173

(56) References Cited

U.S. PATENT DOCUMENTS

| | | | | |
|---|---|---|---|---|
| 5,426,379 A | * | 6/1995 | Trimberger | 326/39 |
| 5,457,408 A | * | 10/1995 | Leung | 326/38 |
| 5,635,855 A | * | 6/1997 | Tang | 326/38 |
| 5,781,756 A | * | 7/1998 | Hung | 711/103 |
| 5,870,586 A | * | 2/1999 | Baxter | 716/16 |
| 5,914,616 A | | 6/1999 | Young et al. | |
| 5,946,478 A | * | 8/1999 | Lawman | 716/17 |
| 6,105,105 A | * | 8/2000 | Trimberger | 711/103 |
| 6,272,669 B1 | * | 8/2001 | Anderson et al. | 716/16 |
| 6,304,101 B1 | * | 10/2001 | Nishihara | 326/41 |

OTHER PUBLICATIONS

AT&T Field Programmable Gate Arrays Data Book Apr. 1995. available from AT&T Microelectronics, pp. 2–40 through 2–42.

* cited by examiner

Primary Examiner—Matthew Smith
Assistant Examiner—Phallaka Kik
(74) Attorney, Agent, or Firm—Lewis C. Lee; Scott R. Brown; Edel M. Young

(57) ABSTRACT

An FPGA architecture and method to reduce the size of the bitstream used in configuring or reconfiguring the FPGA. To facilitate features of the compression process, an FPGA is modified to implement an addressable data register in place of a conventional shift register. This allows data frames to be arranged in order of similarity, and a bitstream formed from one full data frame along with an address into which the frame is to be loaded, and subsequent partial data frames including only changed words along with the row address of the changes and the column address into which modified frames are to be loaded, rather than shifting in entire frames of data for subsequent frames.

22 Claims, 9 Drawing Sheets

METHOD FOR COMPRESSING AN FPGA BITSREAM

CROSS-REFERENCE TO RELATED APPLICATIONS

This application relates to commonly owned pending U.S. patent application Ser. No. 09/374,472 filed Aug. 13, 1999 by Schultz, Young, and Hung, entitled "METHOD AND STRUCTURE FOR READING, MODIFYING AND WRITING SELECTED CONFIGURATION MEMORY CELLS OF AN FPGA", now U.S. Pat. No. 6,255,848, contents of which are incorporated herein by reference.

TECHNICAL FIELD

This invention relates to integrated circuits, particularly programmable logic devices or field programmable gate arrays (FPGAs). More particularly, this invention relates to compression methods for reducing the size of a bitstream used to program an FPGA.

BACKGROUND OF THE INVENTION

Field programmable gate arrays (FPGAs) are configured to perform particular functions by loading a stream of bits, or bitstream, into a memory that controls configuration of configurable logic blocks (CLBs). Each CLB includes configurable logic, horizontal and vertical line segments that connect across adjacent cells to form interconnect lines, and a routing or switching structure to selectively connect the logic to the line segments.

It is sometimes desirable to change the functionality of the FPGA by reconfiguring some or all of the logic blocks. In the past, reconfiguration involved reprogramming the entire FPGA by loading a complete new bitstream into the FPGA to reconfigure all of the CLBs.

As FPGAs have grown rapidly in size, partial reconfiguration techniques have evolved to enable reconfiguration of selected portions of the FPGA without affecting other portions of the same FPGA. Due to the architecture of FPGAs, however, partial reconfiguration has been traditionally limited to reconfiguring entire columns of memory for controlling CLBs.

FIG. 1 shows an FPGA 20 to illustrate the limitations of conventional partial reconfiguration. The FPGA 20 has an array of tiles, each tile comprising configurable logic and related interconnect, which are collectively referred to as a configurable logic block (CLB) 22. For illustration purposes, only a few CLBs are shown in FIG. 1 and only a few of the interconnect lines have been drawn. Typically, an FPGA 20 is implemented with thousands of repeatable CLBs 22, each having many horizontal and vertical line segments. Young, Chaudhary and Bauer in U.S. Pat. No. 5,914,616 describe such a structure in more detail, and this patent is incorporated herein by reference.

Each CLB 22 has configurable logic, horizontal and vertical line segments that connect across adjacent cells to form interconnect lines, and a routing or switching structure to selectively connect the logic to the line segments. configuration of the logic and connection between line segments is controlled by a configuration memory, into which a configuration is loaded for enabling the logic and interconnect lines to perform a desired function. In some FPGAs, data in the configuration memory is loaded by addressing sections of configuration memory on address lines and applying data to data lines. In some FPGAs, a frame of configuration data is fed serially into a shift register, then shifted in parallel to an addressed column of configuration memory cells. Vertical wires form address lines, as represented by address lines 24, that generally span the height of the FPGA. Horizontal wires form data lines, as represented by data lines 26, that usually span the width of the FPGA.

In the FPGA of FIG. 1, configuration data from the bitstream is placed onto the data lines 26 by a shift register 28. The bitstream contains frames of data, where each frame fills the shift register 28 and is used to program one column of memory cells accessed by a corresponding address line. As an example, the shift register 28 might hold a frame consisting of several thousands bits. The bitstream also contains commands to load a corresponding data frame into the shift register and once loaded, commands to select the appropriate address line associated with the data frame.

After an entire frame is loaded into the shift register 28, the data bits may be temporarily transferred to a shadow register 30 so that the shift register 28 is free to begin receiving the next frame of data. An address line is selected to transfer the data from the shadow register 30 via the data lines 26 into selected memory cells of the CLBs. This process is repeated for all address lines 24 to fully program the CLBs 22 on the FPGA 20.

Using conventional methods, FPGA 20 can be partially reconfigured by shifting data bits into the shift register 28 and selecting only the address lines 24 of the CLBs 22 that are being reprogrammed. Unfortunately, since the address lines 24 span entire columns of CLBs 22, all of the CLBs connected by the common address lines 24 are reconfigured, whether or not the programmer wants to change all blocks. This is represented pictorially in FIG. 1 as a partial reconfiguration zone 32.

As FPGAs continue to increase in size and complexity, it would be desirable and advantageous to partially reconfigure smaller sections of the FPGA that include less than all of the CLBs connected to a common address line. Accordingly, there is a need for an improved process or architecture that enables partial reconfiguration of selectable CLBs on the FPGA.

Another problem resulting from the FPGA's rapid growth in size concerns the enormously increasing length of the bitstream used to program the FPGA. Clock speeds used to shift the bitstreams into an FPGA have increased, but less dramatically, thus increasing the length of time required to load the bitstream into the FPGA.

In an effort to address this problem, some FPGA architectures dedicate multiple data pins to receive the bitstream, rather than a single pin as used in earlier design generations. This improvement, however, costs package pins, and there remains a desire to further reduce the time required to configure or reconfigure an FPGA.

One way to improve the speed of FPGA configuration is to reduce the size of the bitstream. Unfortunately, standard compression algorithms used in other signal processing environments are not effective for FPGA bitstreams because they require large amounts of memory. Conventional compression algorithms that do not require large amounts of memory, such as run length encoding (RLE), have not proven effective with typical bitstream data. Accordingly, there remains a need to compress the size of the bitstream in a way that reduces the length of time required to load the bitstream into the FPGA.

SUMMARY OF THE INVENTION

This invention relies on an FPGA architecture that can reconfigure a part of the FPGA at a resolution of one word.

In one embodiment, the method enables partial reconfiguration of selectable configurable logic blocks (CLBs) connected to one or more address lines, without affecting other CLBs connected to the same address lines.

This invention concerns a system and method to reduce the size of the bitstream used in configuring or reconfiguring the FPGA. The compression method evaluates the configuration data and identifies, for a given frame, the most similar frame in the configuration data. The most similar frame may be an identical frame, in which all words or bits are the same, or a similar frame in which only a few bits or words differ between them. The compression method reorganizes the frames within the bitstream to group the similar frames so that the amount of data bits being changed from one frame to the next is minimized. Duplicated words/bits that do not change from one frame to the next are removed, leaving only their corresponding commands and addresses for selecting the address lines that are intended to program cells with this data.

To enable loading of individual words, as opposed to whole frames, the FPGA is implemented with an addressable data register instead of a conventional shift register. Individual words from a data frame of the bitstream can be loaded directly into the data register at an addressed location.

DETAILED DESCRIPTION OF THE DRAWINGS

This invention concerns improved FPGA architectures and methods that overcome problems associated with the rapidly increasing size and complexity of FPGAs. The architectures and methods improve the speed and efficiency of configuring, reconfiguring, or partially reconfiguring configurable logic blocks (CLBs) in the FPGA. One aspect of the invention concerns an improved partial reconfiguration technique that allows reconfiguration of CLBs at a CLB resolution, or even a finer memory cell resolution. This means that CLBs or memory cells addressed by a common address line can be reconfigured independently of one another. Another aspect of the invention concerns compression techniques to reduce the size of the bitstream used in configuring or reconfiguring the FPGA. These and other aspects are discussed separately below.

Improved Partial Reconfiguration

Described are two exemplary approaches to achieving versatile reconfiguration of an FPGA at a CLB resolution or finer. One approach is to control the input signals being applied to memory cells in such a way that certain ones of the memory cells addressed by a common address line are selectively programmed while others are not. A second approach is to modify the FPGA architecture to allow individual selection of CLBs for reconfiguration purposes. These approaches are described separately below.

Technique I: Input-Driven Partial Reconfiguration

Figure 1:
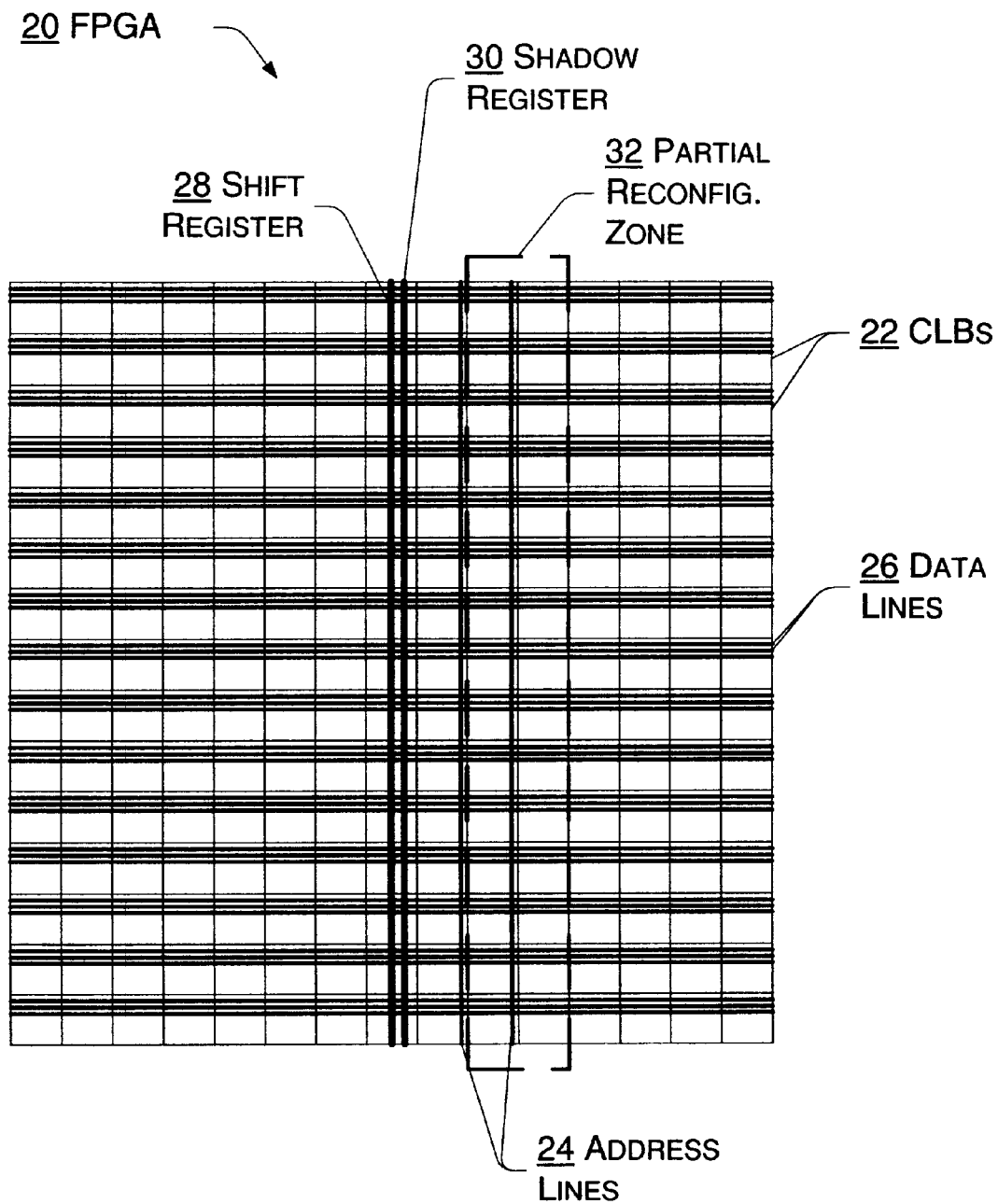
FIG. 1 is a diagrammatic illustration of a conventional field programmable gate array (FPGA).
Figure 2:
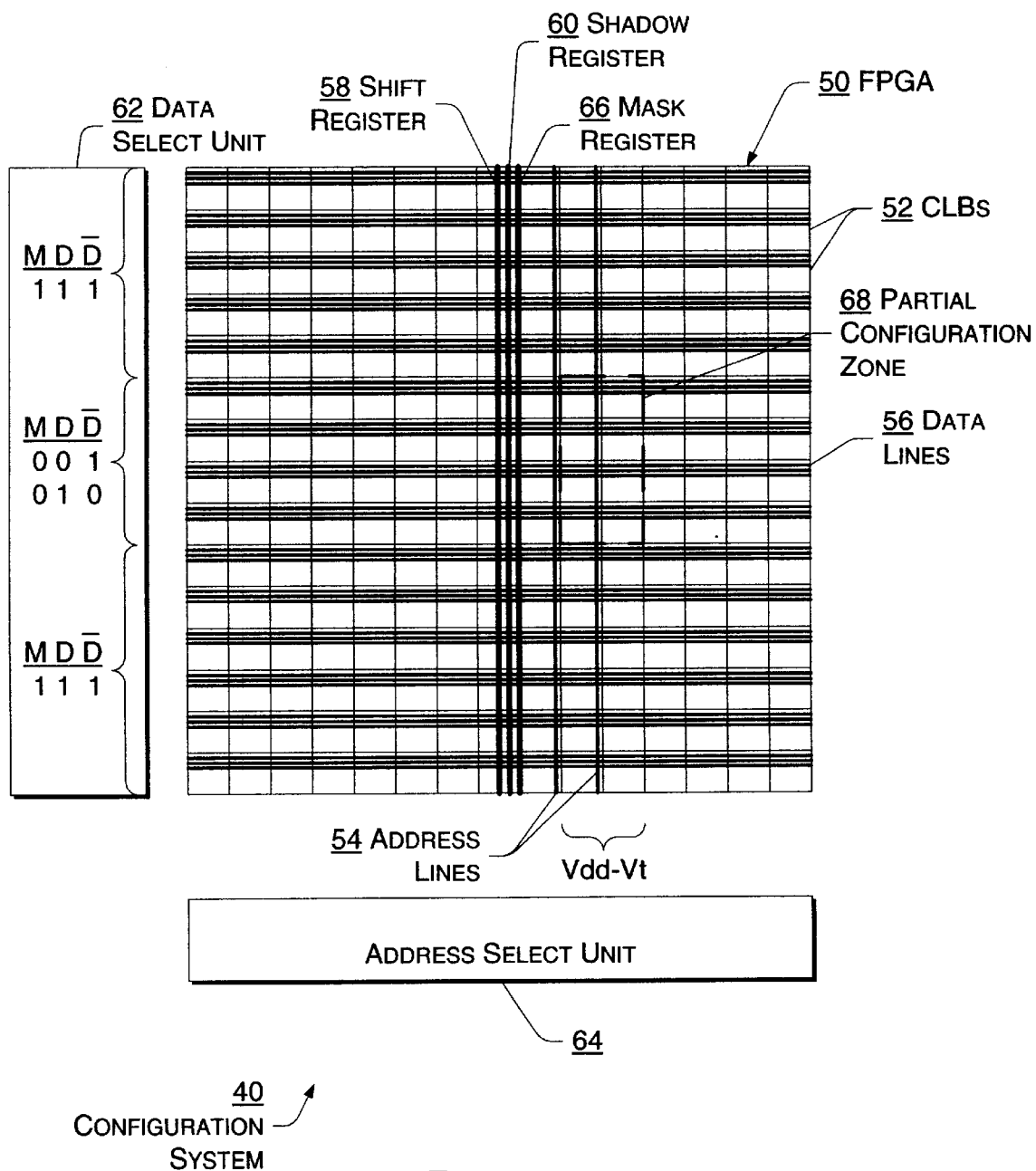
FIG. 2 is a diagrammatic illustration of a configuration system that partially reconfigures an FPGA at a memory cell resolution.

FIG. 2 shows a configuration system 40 that can be used to configure, reconfigure, or partially reconfigure an FGPA 50. The FPGA 50 has an array of tiles or configurable logic blocks (CLBs) 52. For illustration purposes, only a few CLBs are shown, but typically there are thousands of CLBs per FPGA. The FPGA has multiple address lines 54 formed by connecting vertical line segments of adjacent CLBs 52. The FPGA also has multiple data lines 56 formed by connecting horizontal line segments of adjacent CLBs 52. A shift register 58 spans vertically across the FPGA to provide data to the data lines 56 and a shadow register 60 provides temporary storage for data frames being programmed into memory cells of the CLBs 52. The above-described layout of FPGA 50 is conventional and well known in the art.

The configuration system 40 includes a data select unit 62 and an address select unit 64 that provide the logic for selecting the data lines 56 and address lines 54 of the FPGA. The data select unit 62 and address select unit 64 are configured to apply specific combinations of data values and address line voltages to the FPGA to selectively program memory cells connected to a common address line.

The otherwise conventional FPGA 50 is modified to include a mask register 66 that runs vertically beside the shift register 58 and shadow register 60. The mask register 66 selects which memory cells receive the specific combinations of data values for programming and which memory cells do not, thereby defining a partial reconfiguration zone 68. The mask register 66 provides one bit of control information for each data row. One value causes the memory cell to be programmed, whereas the other value blocks the cell from being programmed. The operation of mask register 66 is described below in more detail, following a brief explanation of the memory cell and how the combinations of data values and address line voltages program selected memory cells connected to a common address line.

Figure 3:
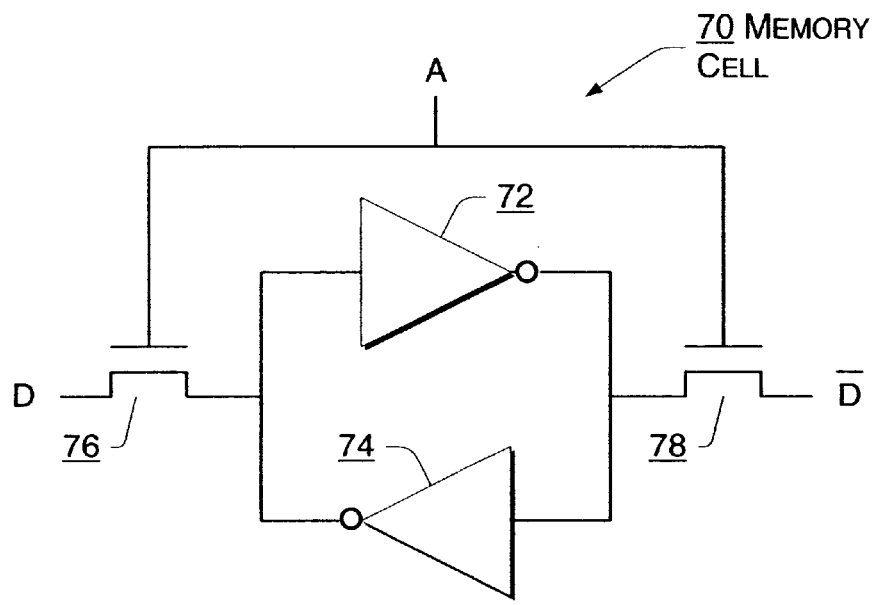
FIG. 3 is a circuit diagram of a configurable memory cell employed in a configurable logic block of the FPGA of FIG. 2.

FIG. 3 shows a standard configurable memory cell 70 having two inverters 72 and 74 that are addressed by an address line A. When the address line A is selected, transistors 76 and 78 activate to couple the inverters 72 and 74 to a pair of complementary data lines D/D' (herein, the notation D' refers to D bar). During programming, data bits on the data lines are written into the inverters 72 and 74; whereas during reading, the data stored in inverters 72 and 74 is transferred out onto the data lines. The memory cell 70 is programmed or read according to the conventional values and voltage levels in the following truth table 1:

TABLE 1

Conventional Program/Read Truth Table

| D | D' | A | Operation |
|---|---|---|---|
| 0 | 1 | Vdd | Write 0 |
| 1 | 0 | Vdd | Write 1 |
| 1 | 1 | Vdd-Vt | Read |

According to this conventional approach, all memory cells connected to common address line A are programmed simultaneously by placing a value of 1 or 0 on the data line D (with the converse value on data line D') and applying a voltage Vdd on the address line. To read all memory cells connected to the address line, the data lines pairs are driven high to a binary value of "1" and then allowed to float. The address line A is then strobed at a voltage Vdd-Vt, which is sufficient to barely turn on transistors 76 and 78. The charge stored in the inverters 72 and 74 slowly leaks out to drive the data lines in opposite directions depending on the value stored in the memory cell.

In contrast to this traditional approach, an improved partial reconfiguration method drives the address line at the same voltage regardless of whether a memory cell is being reconfigured and selectively applies values to the data lines to control whether a certain memory cell is reprogrammed or not. More particularly, the address line A is driven by a lower voltage Vdd-Vt, where Vdd is the supply voltage (e.g., 1.5 V) and Vt is a threshold voltage (e.g., 0.5 V) for transistors 76 and 78. The lower voltage is used because driving the voltage on address line A to a higher voltage Vdd would cause the data lines, which have a large capacitance, to destroy the values in the memory cells that are not being reconfigured.

If the memory cell 70 is to be reprogrammed, the mask register 66 applies a first binary value (e.g., "0") to select the complementary data line pair D/D' as the ones to handle programming data. Data value pairs 0/1 or 1/0 are then placed on the complementary data line pair D/D' to program the attached memory cell.

If the memory cell 70 is not to be reprogrammed, the mask register 66 applies a second binary value (e.g., "1") to select the complementary data line pair D/D' and data values 1/1 are placed on the data line pair D/D'. Applying a value pair 1/1 is akin to reading the memory cell, which effectively prevents data from being programmed into the cell. The partial configuration inputs are summarized in the following truth table 2:

TABLE 2

Truth Table for Partial Reconfiguration Method

| Mask | D | D' | A | Operation |
|---|---|---|---|---|
| 0 | 0 | 1 | Vdd-Vt | Reconfigure; Write 0 |
| 0 | 1 | 0 | Vdd-Vt | Reconfigure; Write 1 |
| 1 | 1 | 1 | Vdd-Vt | No Operation or Read |

FIG. 2 illustrates the partial reconfiguration method with respect to FPGA 50. Suppose that the programmer would like to reconfigure only the CLBs within the partial reconfiguration zone 68. The address select unit 64 applies a voltage level Vdd-Vt to one of the address lines servicing the CLBs within the zone 68. The data select unit 62 assigns a mask (M) value of "0" and value pairs of 1/0 or 0/1 (depending upon the value to be written into the memory cell) to data lines servicing the memory cells to be programmed. The data select unit 62 simultaneously assigns a mask value of "1" and value pairs of 1/1 to data lines servicing memory cells that are not intended to be programmed. It is noted that with this technique, the reconfiguration zone 68 may occupy multiple zones all over the FPGA, rather than just one rectangular area as shown in FIG. 2 for illustration purposes.

Voltages for the address and data lines and component sizes in the memory cell 70 are chosen to establish an inversion or trip point that can be more precisely controlled so that a value pair 0/1 or 1/0 causes the memory cell to flip whereas a value pair 1/1 does not. A "trip point" is the point at which the inputs of data lines D/D' and address line A cause the inverters 72 and 74 to switch from storing one binary value to the other binary value. Suitable voltages and sizes depend upon the process for manufacturing and on other circuit characteristics.

This first technique for partial configuration is advantageous in that the only changes made to the FPGA architecture are possible size changes to memory cell components and addition of a mask register. In addition, the address line select unit needs only drive the address at a single voltage. Reconfiguration at the memory cell level is managed by the voltage levels applied to the address and data lines.

Technique II: Modified FPGA Architecture

Figure 4:
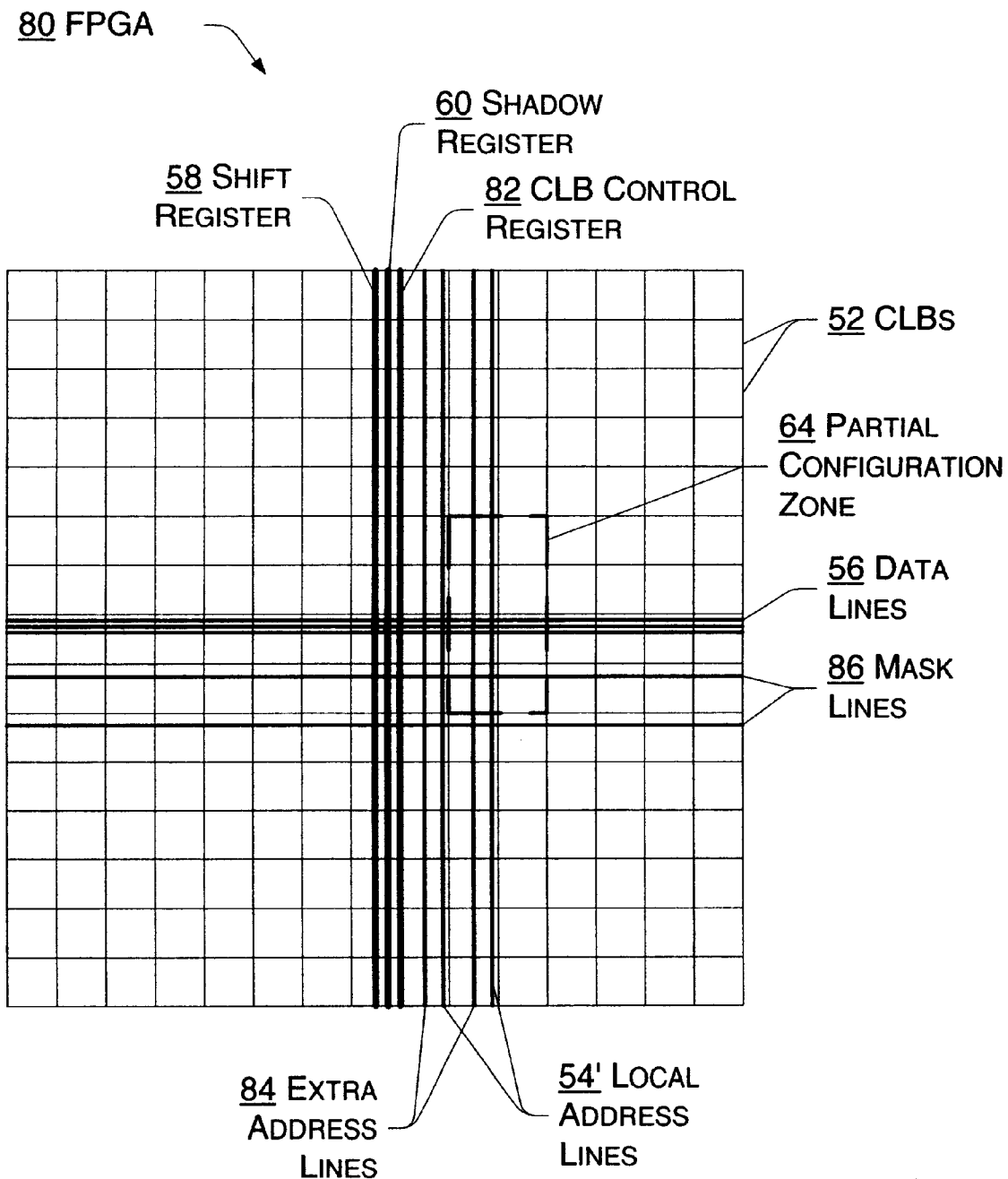
FIG. 4 is a diagrammatic illustration of an FPGA having a modified architecture to enable partial reconfiguration at a CLB resolution.

Another approach to enabling partial reconfiguration at a CLB resolution is to modify the FPGA so that individual CLBs are addressable. FIG. 4 shows an FPGA 80 that is similar to a conventional FPGA in that it has CLBs 52, address lines 54', data lines 56, a shift register 58, and a shadow register 60. Unlike conventional FPGAs, however, FPGA 80 is further equipped with a CLB control register 82 that runs vertically beside the shift register 58 and shadow register 60. FPGA 80 is also modified to include an extra set of address lines 84 in addition to the existing address lines 54'. In one implementation, there is an extra address line 84 for each of the original address lines 54', thereby doubling the number of vertical configuration address lines in each CLB. It is further noted that in the FIG. 4 implementation, the address lines 54', are broken and not continuous across CLB boundaries thus forming address lines that are local to respective CLBs. The local, non-continuous address lines are referenced with number 54' to distinguish from the address lines 54 of FPGA 50 in FIG. 2.

FPGA 80 also includes extra horizontal CLB mask lines 86 that are addressed by the CLB control register 82. Preferably, there is one CLB mask line 86 per CLB 52. The CLB mask lines 86 and extra address lines 84 combine to access the existing local address lines 54', thereby enabling selection of individual CLBs 52 so that a particular CLB can be reconfigured without affecting other CLBs.

Figure 5:
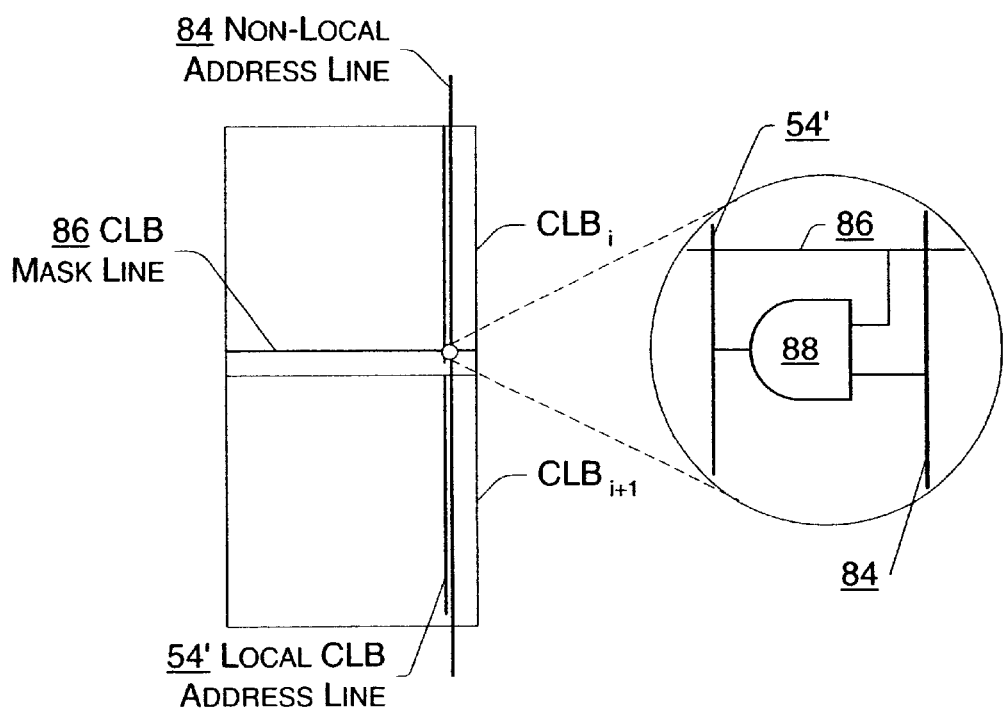
FIG. 5 is a diagrammatic illustration of adjacent configurable logic blocks in the FGPA of FIG. 4.

FIG. 5 shows two adjacent configurable logic blocks $CLB_i$ and $CLB_{i+1}$ taken from FPGA 80. In addition to standard interconnect line segments, each CLB is equipped with one horizontal CLB mask line 86, and an extra address line 84 per local address line 54'. An AND gate 88 is located at the junction of a full-height non-local address line 84 and a CLB mask line 86. The AND gate 88 has inputs connected to the non-local address line 84 and CLB mask line 86, and an output connected to the local address line 54'.

To reconfigure a designated CLB, the non-local address line 84 and CLB mask. line 86 intersecting the designated CLB are selected. With both inputs selected, the AND gate 88 selects the local address line 54'. Data lines running to the CLB are then used to reconfigure the memory cells. The non-local address lines 84 and/or CLB mask lines 86 that service CLBs not intended to be reconfigured are keptdeselected. The following table 4 illustrates the reconfiguration control.

TABLE 4

Truth Table for FIG. 5

| mask line 86 | Add Line 84 | Local Line 54' | D | D' | Operation |
|---|---|---|---|---|---|
| Selected | Deselected | Deselected | N/A | N/A | No Operation |
| Deselected | Selected | Deselected | N/A | N/A | No Operation |
| Selected | Selected | Selected | 0 | 1 | Reconfigure; Write 0 |
| Selected | Selected | Selected | 1 | 0 | Reconfigure; Write 1 |

This second technique for partial configuration is advantageous in that reconfiguration at a CLB resolution is guaranteed to be reliable over a variety of process conditions. However, these added components increase the cost and size of the chip.

Bitstream Compression

Another aspect of the invention concerns compression techniques that reduce the size of the bitstream used in configuring or reconfiguring an FPGA. As noted above, the conventional approach to programming the FPGA involves shifting a frame of bits into the shift register and strobing an address line to program the memory cells addressed by the address line. With thousands of bits per frame and thousands of addressable locations, the shift register handles millions of bits during the repetitive configuration process, which can be time consuming.

Generally, the bitstream compression technique identifies frames in the configuration data that are most similar to one another. Such frames may be identical or differ in one or a few words or bits. The configuration data is then reorganized to group these frames together. A compressed bitstream is produced by removing data that does not change from one frame to the next. To enable loading of individual words, as opposed to whole frames, the FPGA is implemented with an addressable data register in place of a conventional shift register.

Figure 6:
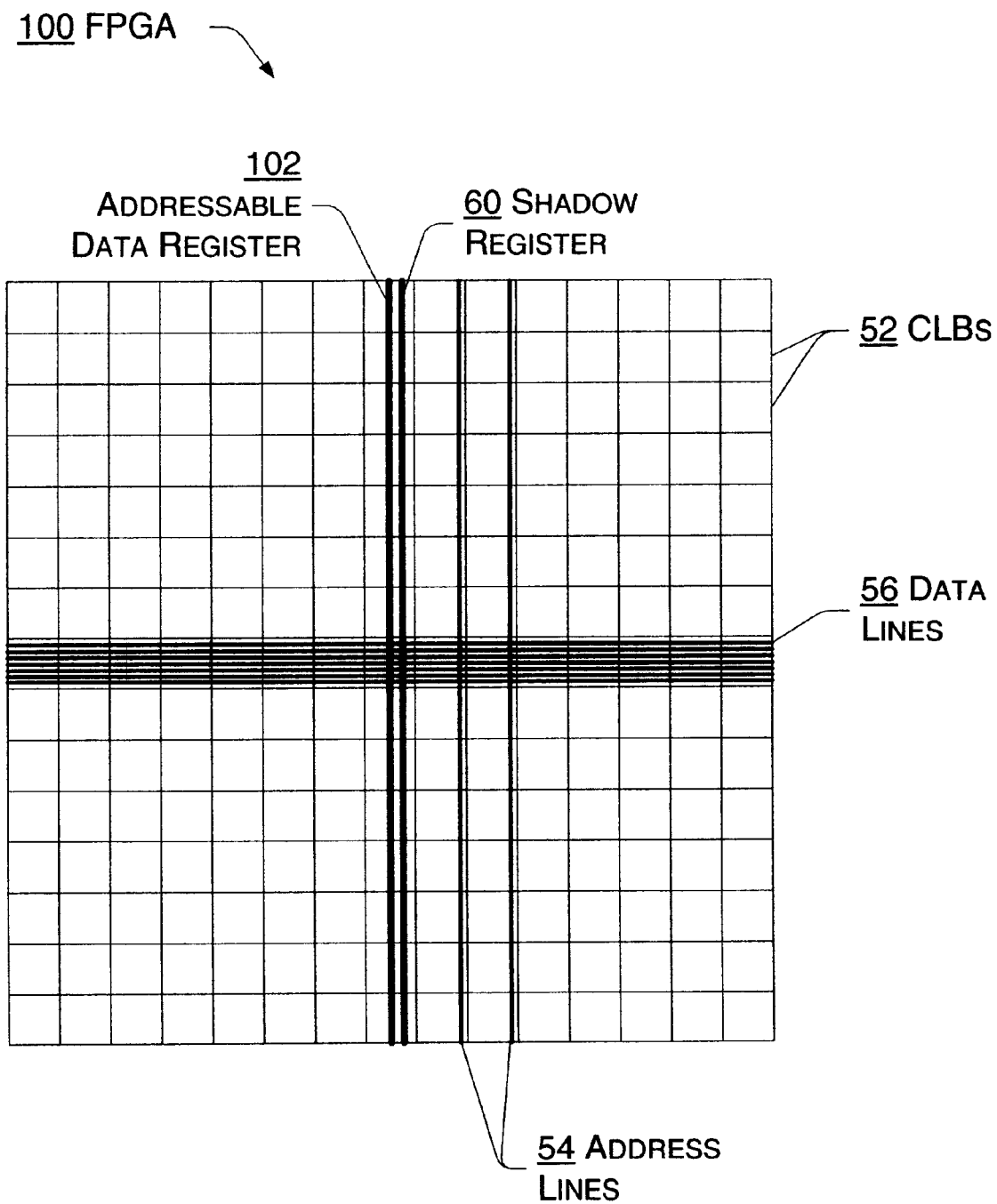
FIG. 6 is a diagrammatic illustration of a field programmable gate array (FPGA) with an addressable data register.

FIG. 6 shows an FPGA 100 that implements an addressable data register 102 in place of the shift register 58. The addressable data register 102 enables access to sets of bits within the frame. For instance, the addressable data register 102 permits addressing of N-bit sub-frames (e.g., 16-bit or 32-bit words) within each data frame (e.g., thousands of bits) of the bitstream. As a result, an N-bit sub-frame can be written directly to an addressable location of the register 102, rather than being serially shifted to that location over the length of a shift register, thereby improving speed and efficiency in comparison to a conventional shift register.

The FPGA 100 can be implemented with a mask register as described above with respect to FIG. 2. With this architecture, a programmer can write one or more words of data to address locations in the addressable data register 102, and then use the mask register 66 and data value inputs to program specific memory cells within the FPGA without affecting other memory cells.

Alternatively, the FPGA 100 can be further implemented with the modifications described above with respect to FIGS. 4 and 5. With this architecture, a programmer can write one or more words of data to address locations in the addressable data register 102, and then use the CLB control register 82, CLB mask lines 86, and non-local address lines 84 to program specific CLBs without affecting other CLBs.

Figure 7:
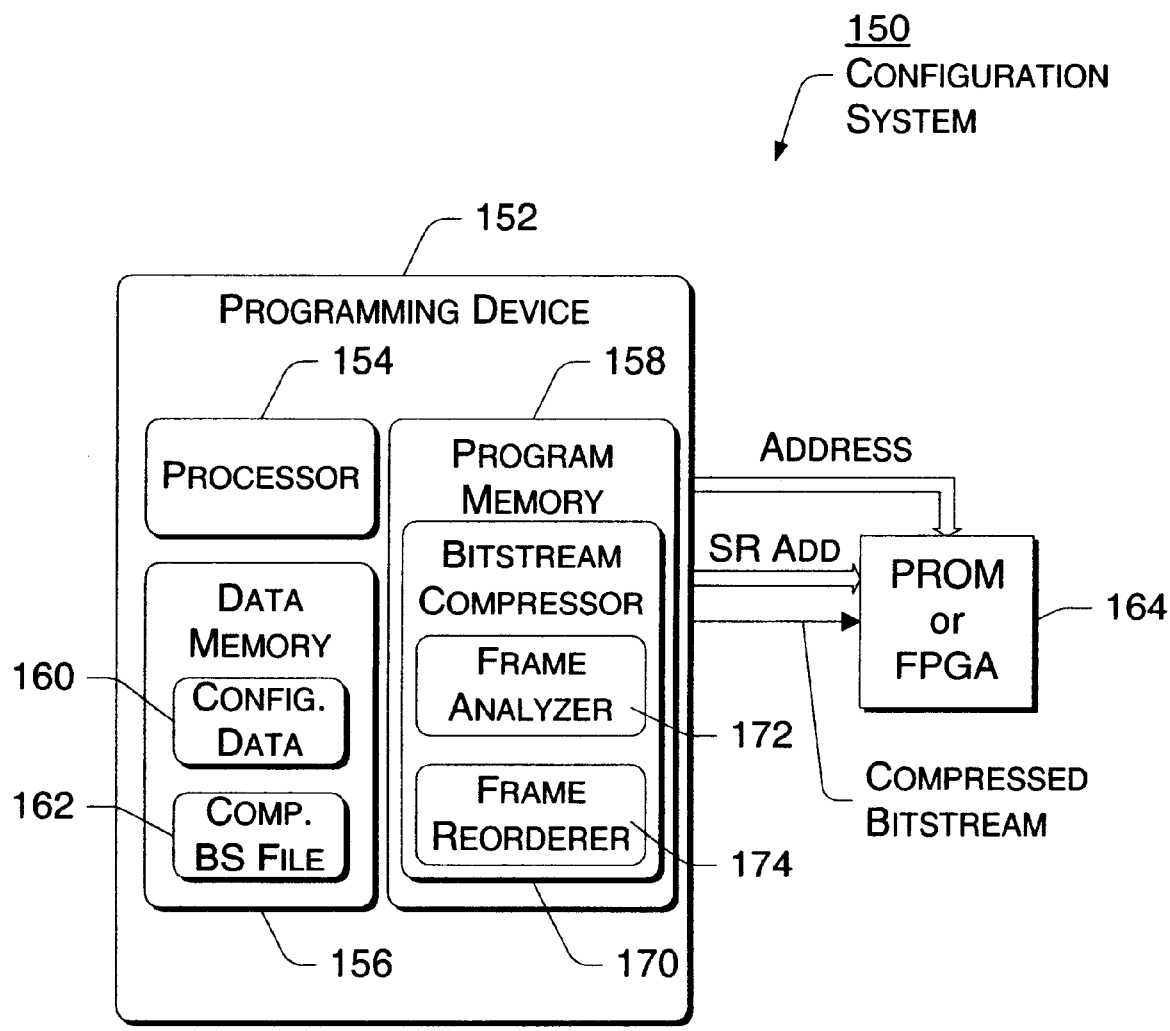
FIG. 7 is a block diagram of a configuration system that implements a bitstream compression process.

FIG. 7 shows a configuration system 150 that implements the bitstream compression process to improve the speed at which FPGAs are configured or reconfigured. The configuration system 150 has a programming device 152 that produces a compressed bitstream used to configure and/or reconfigure an FPGA. The programming device 152 has a processor 154, a data memory 156, and a program memory 158. The programming device 152 may be implemented, for example, as a general-purpose computer.

Configuration data 160 is stored in the data memory 156. The configuration data 160 contains the data for complete configuration of an FPGA. It may be embodied as an uncompressed bitstream or in some other format, so long as it includes the data frames, commands, and addresses needed to configure the FPGA. The programming device 152 compresses the configuration data 160 into a compressed bitstream that may be stored as a file 162 in data memory 160, programmed into a programmable read only memory (PROM), or loaded into an FPGA (both referenced by number 164). The compression technique is particularly well suited for FPGA 100, which has an addressable data register 102. However, some features of the compression technique may be used effectively with other types of FPGAs that do not implement an addressable data register, such as FPGA 50 (FIG. 2) and FPGA 80 (FIG. 4).

A compression program 170 is stored in program memory 158 and executed on processor 154. The compression program 170 has a frame analyzer component 172 that evaluates the configuration data 160 and identifies, for a given frame, the most similar frame in the configuration data. The most similar frame may be an identical frame, in which all words or bits are the same, or a similar frame in which only a few bits or words differ from those in the given frame. The frame analyzer 172 may further differentiate between two otherwise identical next-frame candidates (i.e., the number of bits/words that change from a current frame to the next frame is the same) according to a cost analysis. The cost analysis evaluates which of the frames, if taken next in the compressed bitstream, would result in a less costly programming sequence.

The compression program 170 has a frame reorderer component 174 to reorganize the frames within the configuration data to group the similar frames so that the number of data bits being changed from one frame to the next is minimized. The frame reorderer 174 then produces a compressed bit stream by removing duplicated words/bits that do not change from one frame to the next, leaving only those words/bits that change (if any) and the corresponding commands and addresses for selecting the address and data lines that are intended to program cells with this data. The result is a compressed bitstream that is smaller than the uncompressed data 160.

Although the compression program 170 is illustrated as a software program, it may alternatively be implemented in hardware or firmware as part of the processor 154 or other dedicated component.

Figure 8:
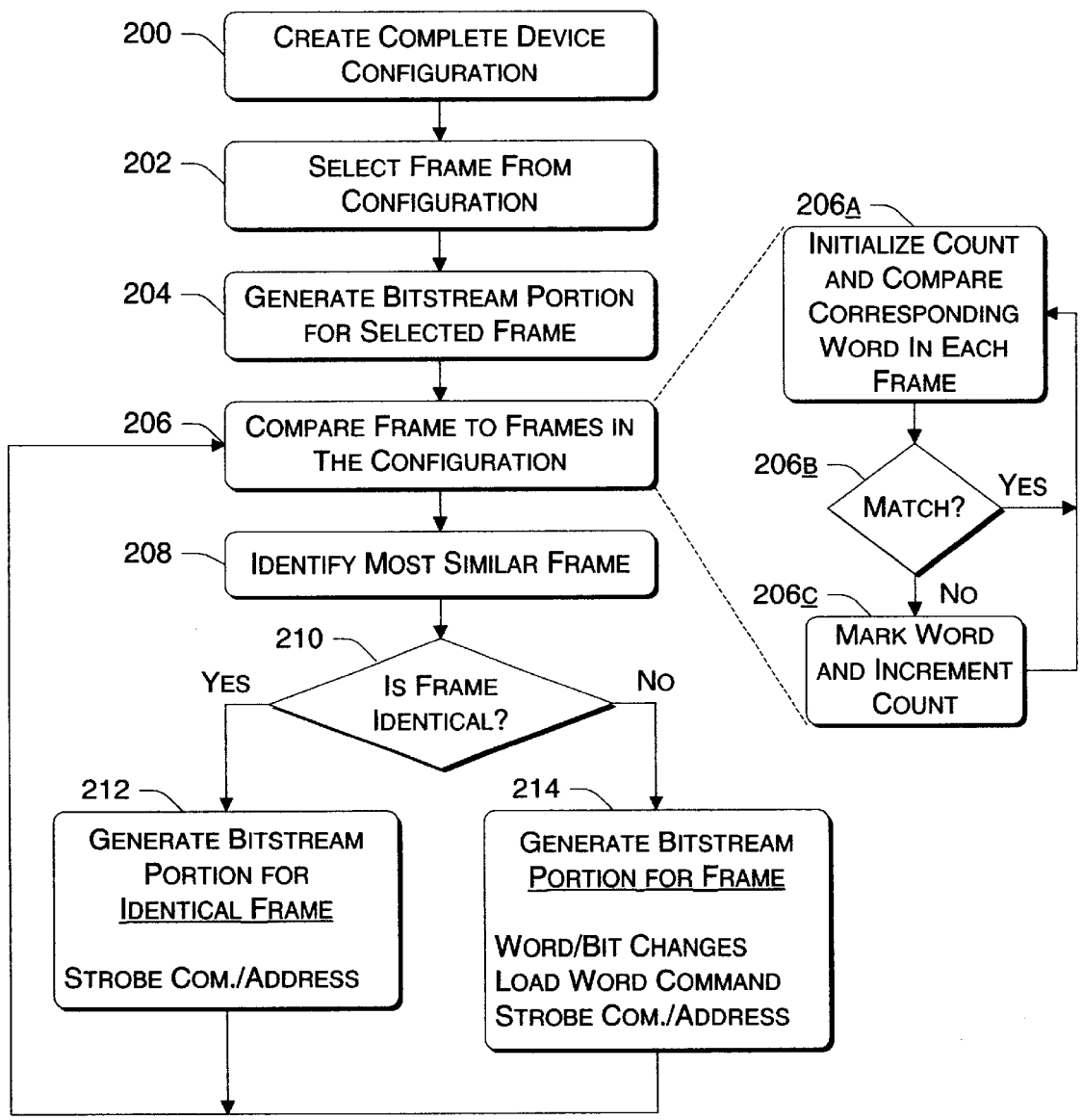
FIG. 8 is a flow diagram showing a method for configuring an FPGA using the bitstream compression process implemented by the configuration system of FIG. 7.

FIG. 8 shows in more detail the general compression process embodied in the compression program 170. At step 200, configuration data 160 is created and stored in data memory 156. The configuration data includes data and commands sufficient to completely configure an FPGA. At step 202, the compression program 170 selects a frame from the configuration data for analysis. This frame is stored in a data buffer or memory. The bitstream portion for the selected frame is then generated (step 204). This bitstream portion includes a load command, followed by a data frame, followed by a strobe command to assert the appropriate address line used to select the memory cells being programmed with the data frame.

At step 206, the frame analyzer 172 compares other frames in the configuration data to the selected frame. In one implementation, the frame analyzer 172 compares each pair of frames, word by word. For each corresponding word pair, the analyzer 172 determines whether the two words match (steps 202A and 202B). If the words match, the process continues to the next two words. If the words do not match, the word in the frame being compared is marked or otherwise identified and a word count is incremented (step 206C). This sub-process outputs a count of the words that do not match and a list of marked words.

From the comparison, the frame analyzer 172 identifies the frame that is most similar to the selected frame (step 208). The most similar frame may be identical (i.e., no marked words) or similar (i.e., one or a few marked words).

In the event that two "next frame" candidates appear to be tied for most similar to the selected frame, the frame analyzer 172 may perform a cost analysis to determine which of the two next-frame candidates is more favorable. This optimization is based on an analysis of which order of frames would result in lower processing costs in terms of higher speeds and fewer clock cycles to process. If the structure includes circuitry that can increment the address without having to receive a new address, then it is less costly to increment the address to the next adjacent address than to supply a full address. As an example, suppose two next-frame candidates have only two words that differ from the selected frame. Further suppose that the two words in the first of these frames are adjacent within the frame, whereas the two words in the second of these frames are farther apart. The frame analyzer 172 deems the first frame less costly because it requires fewer bitstream commands to modify adjacent words within their frame and write them into the addressable data register than it does to write words that are separated within their frame.

Accordingly, the frame analyzer 172 may be configured to implement an optimization analysis that ranks otherwise identical next-frame candidates according to the following rules:

Rule 1: Identify the frames with the fewest different words from the current frame.

Rule 2: Frames with fewer clumps of marked words are chosen over frames with marked words farther apart.

Rule 2: Frames that are adjacent to the selected frame are chosen over frames that are farther away from the selected frame.

The frame reorderer 174 reorganizes the frames so that the most similar frame follows sequentially in the compressed bitstream. This is done in one of two ways, depending upon whether the next frame is identical (step 210). If the next frame is identical (i.e., the "yes" branch from step 210), the frame reorderer 174 generates a bitstream portion that has the strobe command and address for the next frame, but does not include the redundant data frame (step 212). In this manner, the original configuration data is compressed because the load command and data frame for the next frame is removed entirely from the bitstream.

If the next frame is not identical (i.e., the "no" branch from step 210), the frame reorderer 174 generates a bitstream portion that includes only those bits/words that are different from the current frame, a load command for loading the bits/words, and the strobe command and address for the next frame (step 214). Again, the original configuration data is compressed because a large amount of data is removed.

The process continues with comparison of remaining frames to the next frame. The result of this iterative approach is a compressed bitstream file 162.

Figure 9:
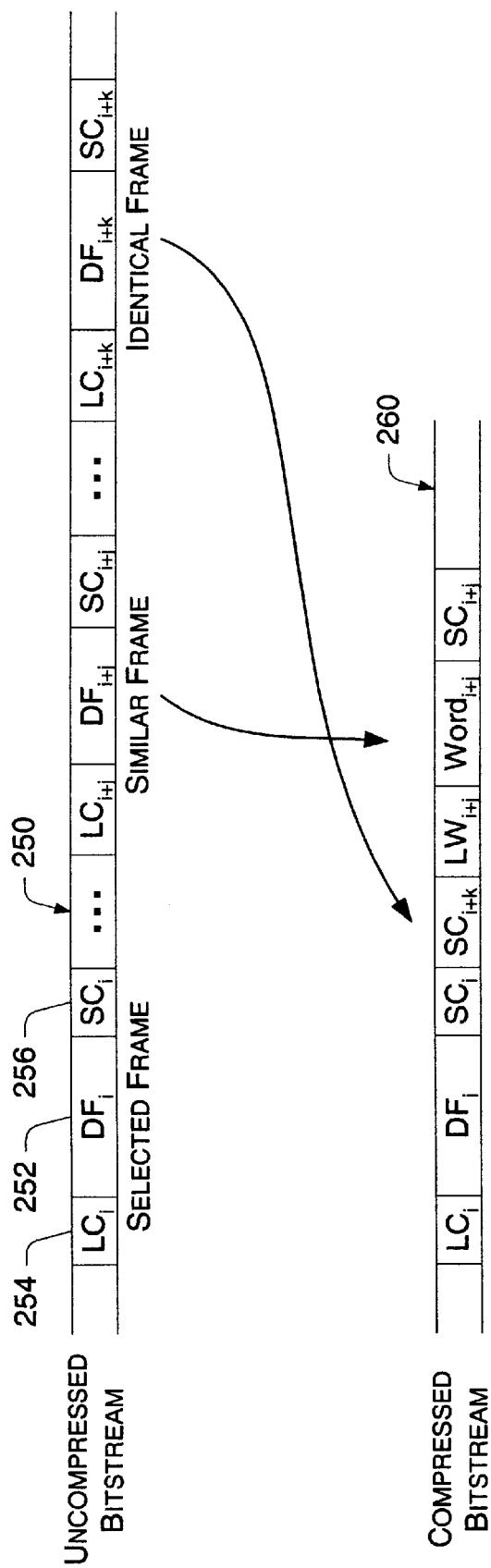
FIG. 9 is a diagrammatic illustration of a bitstream in an uncompressed state and in a compressed state.

FIG. 9 shows part of an uncompressed bitstream 250 and a corresponding part of a compressed bitstream 260 to illustrate the compression process. The uncompressed bitstream 250 consists of multiple data frames 252, which are represented by data frames $DF_i, \ldots DF_{i+j}, \ldots DF_{i+k}$, etc. The bitstream has multiple load commands 254, represented as $LC_i, \ldots LC_{i+j}, \ldots, LC_{i+k}$, etc., for each of the data frames 252. Each load command directs the FPGA to load the corresponding data frame into the addressable register. The load command typically includes size information indicating the length of the following data frame. The bitstream 250 also has strobe commands 256, represented as $SC_i, \ldots SC_{i+j}, \ldots, SC_{i+k}$, etc., for each of the data frames. Each strobe command identifies an address line that is selected to program the particular memory cells with the corresponding data frame.

The compressed bitstream 260 is created as a result of the compression process of FIG. 8. In this example, suppose that the first data frame $DF_i$ is the selected frame, data frame $DF_{i+k}$ is the next most similar frame (which happens to be identical to the selected frame) and data frame $DF_{i+j}$ is the next most similar frame. In this case, the identical data frame $DF_{i+k}$ and corresponding load command $LC_{i+k}$ are eliminated, thereby compressing the bitstream, and the corresponding strobe command $SC_{i+k}$ is reordered within the bitstream to follow the strobe command $SC_i$ of the selected data frame $DF_i$. In this manner, the same data is used to program two different columns of cells via the sequential strobe commands.

The similar data frame $DF_{i+j}$ is reorganized with the bitstream to follow the selected data frame $DF_i$. The similar data frame is also reduced in size to include only the words that change from data frame $DF_i$ to similar data frame $DF_{i+j}$ and word addresses for the addressable data register. The reduced data frame is pictorially represented as $Word_{i+j}$. The load command is replaced with a load word command (LW) that contains the address of the addressable register to load the word. If multiple words change, multiple combinations of the LW-Word-SC sequence are strung together in the bitstream, which is still smaller in size than the entire frame of data. Through these changes, the compressed bitstream 260 is significantly smaller than the uncompressed bitstream 250.

Exemplary Compression Process for Identical Frames

Figure 10:
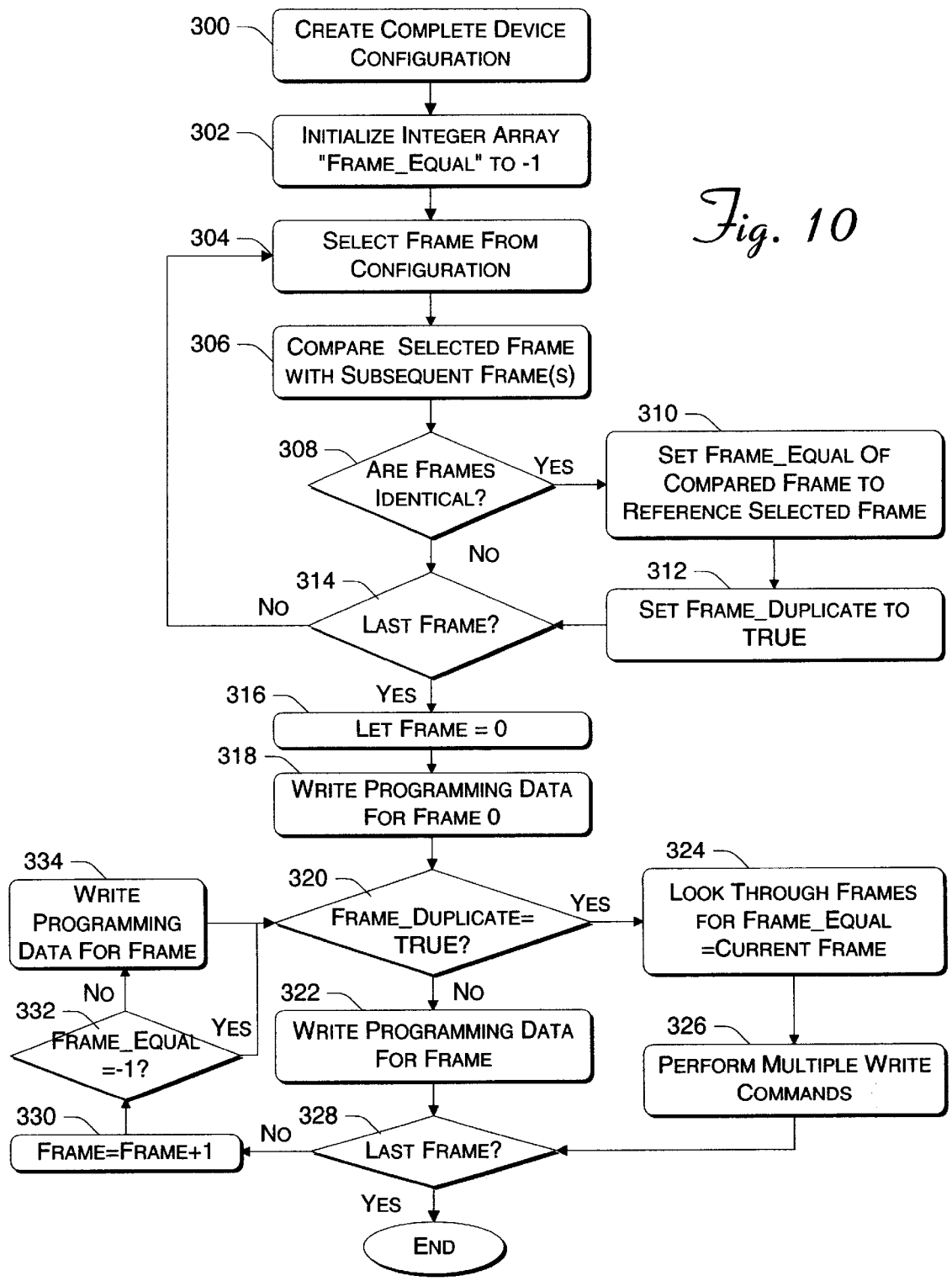
FIG. 10 is a flow diagram showing a method for compressing a bitstream to remove identical frames.

The process illustrated in FIG. 8 describes a general compression technique that accounts for both identical and similar frames. FIG. 10 shows a method for compressing a bitstream to remove identical frames according to one specific implementation of the FIG. 8 process.

At step 300, configuration data is created and stored in data memory. The configuration data includes data and commands sufficient to completely configure an FPGA. At step 302, the compression program initializes an integer array called "Frame_Equal" to a value, such as "−1". The compression program then selects a frame from the configuration data for analysis (step 304). This frame is stored in a data buffer or memory.

At step 306, the compression program compares the selected frame with each subsequent frame. If any subsequent frame is identical to the selected frame (i.e., the "yes" branch from step 308), the compression program sets the Frame_Equal array entry for that frame equal to the number of the current frame, thereby referencing the current frame (step 310). In addition, the compression program sets a second parameter known as "Frame_Duplicate" to TRUE to indicate that the selected frame has a duplicate frame somewhere else in the configuration data. After all frames after the selected frame are compared, the process selects the next frame in the configuration data, as represented by the "no" branch from step 314 and the arrow back to step 304.

After all frames have been evaluated for duplicates (i.e., the "yes" branch from step 314), the program sets an initial frame count to the first frame 0 (step 316) and writes the programming data for that frame (step 318). At step 320, the compression program determines whether there is another duplicate frame out there by checking whether Frame_Duplicate for the frame is TRUE. If not, the program simply writes the programming data for that frame (step 322). One skilled in the art will appreciate that this step 322 may be omitted for the case of frame 0 because the programming data for this frame was already written at step 318.

If Frame_Duplicate is TRUE (i.e., the "yes" branch from step 320), the program evaluates the rest of the frames looking for the duplicate frames. This is done by checking the Frame_Equal array for any entries equal to the current frame, such as frame 0 in the initial case (step 324). The program then performs multiple write commands to account for the duplicate frames (step 326).

The process continues for all frames in the configuration data, as represented by decision step 328. If the last frame has not been reached (i.e., the "no" branch from step 328), the frame count is incremented (step 330) and the Frame_Equal array is consulted to determine whether the entry corresponding to the next frame equals the initialized value of −1 or a value referencing a second frame (step 332). This step discerns whether this frame has already been accounted for as a duplicate frame. If Frame_Equal is not set to the initialization value of −1 (i.e., the "no" branch from step 332), the compression program writes the programming data for that frame (step 334) and continues to the evaluation of whether that frame has other duplicates at step 320. Otherwise, if Frame_Equal equals the initialization value (i.e., the "yes" branch from step 332), the process proceeds directly to step 320.

For similar data frames, the process is similar to that described above. When the most similar data frame has been identified, the changed bits for that data frame (Word$_{i+j}$) are added to the bitstream, and the most similar frame becomes the selected frame. The process is repeated, comparing all unwritten frames to the newly selected frame until all frames are accounted for.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A method for programming a field programmable gate array (FPGA) having addressable frames, comprising:
    selecting a first frame from configuration data used to program an FPGA; and
    searching for a second frame in the configuration data that is most similar to the first frame.

2. The method of claim 1, wherein the searching step continues until all frames in the configuration data are examined.

3. The method of claim 1, wherein the searching step comprises scanning frames of configuration data to locate the second frame.

4. The method of claim 1, further comprising:
    generating a first portion of a bitstream for the first frame; and
    generating a second portion of the bitstream for the second frame, wherein the second portion contains less than all data in the second frame.

5. The method of claim 4, further comprising storing the bitstream on a computer-readable medium.

6. A bitstream stored on the computer-readable medium as a result of the method of claim 5.

7. The method of claim 1, wherein the first frame is used to program first memory cells and the second frame is used to program second memory cells, and the second frame is identical to the first frame, further comprising:
    removing the second frame from a bitstream to compress the bitstream; and
    associating, with the first frame, a command to program the second memory cells.

8. The method of claim 7, wherein the first frame is used to program first memory cells addressed by a first address line and the second frame is used to program second memory cells addressed by a second address line, further comprising:
    loading the first frame from the bitstream in the FPGA; and
    selecting the first and second address lines to program the first and second memory cells.

9. The method of claim 7,. further comprising storing the compressed bitstream on a computer-readable medium.

10. A compressed bitstream stored on the computer-readable medium as a result of the method of claim 9.

11. The method of claim 1, wherein the second frame is similar to the first frame, further comprising:
    generating a portion of a bitstream for the first frame; and
    generating a portion of the bitstream for the second frame that contains bits that differ from those in the first frame.

12. The method of claim 1, wherein two candidates for the second frame are approximately the same in terms of an amount of data that differs from the first frame, further comprising analyzing the two candidates to determine which of the -two candidates, if selected as the second frame, would result in lower processing costs.

13. A computer-readable medium having computer-executable instructions that direct a computing device to:
    select a first frame of a bitstream used to program an FPGA, the first frame being used to program first memory cells addressed by a first address line; and
    identify a second frame in the bitstream that is most similar to the first frame, the second frame being used to program second memory cells addressed by a second address line.

14. A method for programming a field programmable gate array (FPGA), comprising:
    analyzing configuration data used to program an FPGA;
    identifying a first frame and second frame that are most similar to one another; and
    generating a portion of a bitstream containing the first frame and less than all of the second frame.

15. The method of claim 14, wherein the second frame is identical to the first frame, further comprising generating a portion of the bitstream containing the first frame, but omitting the second frame.

16. The method of claim 14, wherein the second frame is identical to the first frame, further comprising generating a portion of the bitstream containing the first frame and address select commands corresponding to the first and second frames, but omitting the second frame.

17. The method of claim 14, wherein the second frame is similar to the first frame, further comprising generating a portion of the bitstream containing the first frame and only data from the second frame that differ from the first frame.

18. The method of claim 14, further comprising storing the bitstream on a computer-readable medium.

19. A bitstream stored on the computer-readable medium as a result of the method of claim 18.

20. A computer-readable medium having computer-executable instructions that direct a computing device to:

analyze configuration data used to program an FPGA;

identify a first frame and second frame that are similar to one another; and generate a portion of the bitstream containing the first frame and less than all of the second frame.

21. A bitstream, embodied on a medium, for programming a field programmable gate array (FPGA) having multiple addressable memory cells that are arranged in multiple addressable rows, and multiple addressable columns, comprising:

a data frame;

a first command to select a first address line to program first memory cells with the data frame; and a second command following the first command to select a second address line to program second memory cells with the data frame.

22. A bitstream, embodied on a medium, for programming a field programmable gate array (FPGA) having multiple addressable memory cells, multiple addressable rows, and multiple addressable columns, comprising:

a first data frame;

a first command to select a first address line to program first memory cells with the first data frame;

one or more data bits from a second data frame following the first data frame and the first command;

one or more addresses to load the data bits into an addressable register to change the first data frame to the second data frame; and a second command to select a second address line to program second memory cells with the second data frame.

* * * * *